United States Patent
Willcox

(10) Patent No.: US 7,177,505 B2
(45) Date of Patent: Feb. 13, 2007

(54) MEMS-BASED ACTUATOR DEVICES USING ELECTRETS

(75) Inventor: Charles R. Willcox, Eden Prairie, MN (US)

(73) Assignee: Rosemount Inc., Eden Prairie, MN (US)

( * ) Notice: Subject to any disclaimer, the term of this patent is extended or adjusted under 35 U.S.C. 154(b) by 38 days.

(21) Appl. No.: 10/792,982

(22) Filed: Mar. 4, 2004

(65) Prior Publication Data

US 2005/0196099 A1    Sep. 8, 2005

(51) Int. Cl.
G02B 6/26      (2006.01)
G02B 6/42      (2006.01)
H01L 29/788    (2006.01)

(52) U.S. Cl. .................... 385/52; 385/16; 385/23; 385/25; 257/315

(58) Field of Classification Search ............ 385/140, 385/73, 52, 16, 23, 25
See application file for complete search history.

(56) References Cited

U.S. PATENT DOCUMENTS

| | | | |
|---|---|---|---|
| 4,938,552 A | 7/1990 | Jebengs et al. | 350/96.2 |
| 5,080,458 A | 1/1992 | Hockaday | 385/14 |
| 5,214,727 A | 5/1993 | Carr et al. | 385/22 |
| 5,226,104 A | 7/1993 | Unterleitner et al. | 385/140 |
| 5,319,728 A | 6/1994 | Lu et al. | 385/67 |
| 5,353,363 A | 10/1994 | Keck et al. | 385/46 |
| 5,382,275 A | 1/1995 | Decao et al. | 65/407 |
| 5,404,417 A | 4/1995 | Johnson et al. | 385/137 |
| 5,500,911 A * | 3/1996 | Roff | 385/33 |
| 5,727,099 A | 3/1998 | Harman | 385/52 |
| 5,745,634 A | 4/1998 | Garrett et al. | 385/140 |
| 5,862,003 A | 1/1999 | Saif et al. | 359/871 |

(Continued)

FOREIGN PATENT DOCUMENTS

WO    WO 80/00103    1/1980

(Continued)

OTHER PUBLICATIONS

The International Search Report from Application No. PCT/2005/004027, filed Feb. 10, 2005.

(Continued)

*Primary Examiner*—Brian Healy
*Assistant Examiner*—Charlie Peng
(74) *Attorney, Agent, or Firm*—Westman, Champlin & Kelly, P.A.

(57) ABSTRACT

Electrets are used in a variety of MEMS-based actuator devices. The electret is able to store electrical charge for a long time with negligible charge leakage. Therefore, when an electret is incorporated into a MEMS device that requires actuation, the device can be initially biased to any desired actuation state for a long period of time without the use of external bias voltages. Such a MEMS-based device may include a MEMS-based actuator having at least a first deflectable member and at least a second member. The first deflectable member and the second member are provided with a floating electrode and a second electrode. A charge on the first floating electrode is selected so as to position the first deflectable member at a desired separation distance from the second member. The device may be used to align an optical component or to change the electrical characteristics of an electrical element.

38 Claims, 13 Drawing Sheets

U.S. PATENT DOCUMENTS

| | | | |
|---|---|---|---|
| 5,864,643 A | 1/1999 | Pan | 385/33 |
| 5,907,404 A | 5/1999 | Marron et al. | 356/360 |
| 6,057,520 A * | 5/2000 | Goodwin-Johansson | 200/181 |
| 6,067,183 A * | 5/2000 | Furlani et al. | 359/254 |
| 6,085,016 A | 7/2000 | Espindola et al. | 385/140 |
| 6,130,984 A | 10/2000 | Shen et al. | 385/140 |
| 6,144,794 A | 11/2000 | Mao et al. | 385/140 |
| 6,160,230 A * | 12/2000 | McMillan et al. | 200/181 |
| 6,163,643 A | 12/2000 | Bergmann et al. | 385/140 |
| 6,173,105 B1 | 1/2001 | Aksyuk et al. | 385/140 |
| 6,173,106 B1 | 1/2001 | DeBoynton et al. | 385/140 |
| 6,246,826 B1 | 6/2001 | O'Keefe et al. | 385/140 |
| 6,266,474 B1 | 7/2001 | Han et al. | 385/140 |
| 6,275,320 B1 | 8/2001 | Dhuler et al. | 359/237 |
| 6,275,643 B1 | 8/2001 | Bandy et al. | 385/140 |
| 6,311,010 B1 | 10/2001 | Medeiros | 385/140 |
| 6,320,999 B1 | 11/2001 | Pouteau et al. | 385/23 |
| 6,363,183 B1 | 3/2002 | Koh | 385/19 |
| 6,363,203 B1 | 3/2002 | Dautartas | 385/140 |
| 6,386,507 B2 * | 5/2002 | Dhuler et al. | 251/11 |
| 6,577,793 B2 | 6/2003 | Vaganov | 385/52 |
| 6,597,048 B1 * | 7/2003 | Kan | 257/415 |
| 6,625,356 B2 | 9/2003 | Ticknor et al. | 385/39 |
| 6,628,882 B2 | 9/2003 | Vaganov et al. | 385/140 |
| 6,671,078 B2 * | 12/2003 | Flanders et al. | 359/254 |
| 6,707,981 B2 * | 3/2004 | He | 385/140 |
| 6,782,155 B2 * | 8/2004 | Katayama et al. | 385/19 |
| 6,782,185 B2 * | 8/2004 | Katayama et al. | 385/140 |
| 6,842,563 B2 * | 1/2005 | Zhang et al. | 385/24 |
| 6,869,815 B2 * | 3/2005 | Gasparyan et al. | 438/29 |
| 6,895,161 B2 * | 5/2005 | Romo et al. | 385/140 |
| 2002/0031305 A1 | 3/2002 | Ticknor et al. | 385/48 |
| 2002/0181855 A1 * | 12/2002 | Xue et al. | 385/23 |
| 2003/0012545 A1 * | 1/2003 | Bellman et al. | 385/140 |
| 2003/0137021 A1 | 7/2003 | Wong et al. | 257/416 |
| 2004/0218865 A1 * | 11/2004 | Lu | 385/39 |
| 2004/0263936 A1 | 12/2004 | Nanjyo et al. | 359/212 |
| 2005/0017313 A1 * | 1/2005 | Wan | 257/415 |

FOREIGN PATENT DOCUMENTS

| | | |
|---|---|---|
| WO | WO 00/31767 | 6/2000 |
| WO | WO 02/22494 | 3/2002 |
| WO | WO 03/058286 | 7/2003 |
| WO | WO 03/079384 | 9/2003 |
| WO | WO 04/031822 | 4/2004 |

OTHER PUBLICATIONS

Kurczynski, P. et al., "Membrane Mirrors for Vision Science Adaptive Optics," Proceedings of the SPIE, MOEMS and Miniaturized Systems II, 22024 Oct. 2001, San Francisco, CA, USA, pp. 147-162.

Chan, E. et al., "Electrostatic Micromechanical Actuator with Extended Range of Travel," Journal of Microelectromechanical Systems, IEEE Inc., vol. 9, No. 3, Sep. 1, 2000, pp. 231-328.

Hoffmann, M. et al., "Optical Fibre Switches Based on Full Wafer Silicon Micromachining," Journal of Micromechanics and Microengineering, vol. 9, No. 2, Jun. 1999, pp. 151-155.

* cited by examiner

V-Groove with Steering Electrodes

US 7,177,505 B2

MEMS-BASED ACTUATOR DEVICES USING ELECTRETS

FIELD OF THE INVENTION

The present invention is directed to micro-electrical-mechanical systems (MEMS), and more particularly to MEMS actuator devices that use electrets.

BACKGROUND

Micro-electrical mechanical systems (MEMS) are a class of small mechanical devices that are typically fabricated using planar lithographic techniques originally developed for making semiconductor-based electrical devices. MEMS devices are typically made out of semiconductor materials. The micromachining capabilities provided using MEMS techniques permit the fabrication of mechanical devices with a small size and reliability not previously realized in mechanical systems.

MEMS devices often require electrical activation, typically for translating an element or rotating an element. Electrostatic electrical activation requires that the element to be moved be provided with an electrode. Application of an electrical charge to the element results in an electrical force between the element and another element, resulting in movement of the element.

SUMMARY OF THE INVENTION

Some elements in MEMS devices have to be biased at the same voltage over a long time. However, since a MEMS device is very sensitive even to small changes in voltage, such biasing requires sophisticated and expensive stabilization techniques in order to ensure that the bias voltage remains constant. Moreover, a power supply must operate continuously if the device is to remain in a given state.

One approach to reducing the need for expensive voltage stabilization biasing is to use an electret in the MEMS device. An electret is able to store voltage for a very long time, typically measured in years, with negligible charge leakage. Therefore, when an electret is used, the MEMS device can be initially biased to a desired position. The desired bias position is then maintained for a long period of time without the use of an external bias voltage circuit.

One embodiment of the invention is directed to a MEMS-based optical device that comprises a MEMS-based actuator having at least a first deflectable member and at least a second member. There is at least a first floating electrode disposed on one of the first deflectable member and the second member. The other of the first deflectable member and the second member is provided with a second electrode. A charge on the first floating electrode is selected so as to position the deflectable member at a desired separation distance from the second member. One of the deflectable member and the second member comprises a first optical element. A bias position of the first optical element relative to a second optical element is determined, at least in part, by the position of the deflectable member.

Another embodiment of the invention is directed to a MEMS-based electrical device. A MEMS-based actuator has at least a first deflectable member and at least a second member. At least a first floating electrode is disposed on one of the first deflectable member and the second member. The other of the first deflectable member and the second member is provided with a second electrode. A charge on the first floating electrode is selected so as to position the deflectable member at a desired separation distance from the second member. At least one of the deflectable member and the second member comprises an electrical element having an electrical characteristic dependent on a position of the first deflectable member relative to the second member.

Another embodiment of the invention is directed to a MEMS-based device that comprises a MEMS-based actuator having at least a first deflectable member and at least a second member. At least a first floating electrode is disposed on one of the first deflectable member and the second member. The other of the first deflectable member and the at least a second member is provided with a second electrode. A charge on the first floating electrode is selected so as to position the first deflectable member at a desired separation distance from the second member. The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
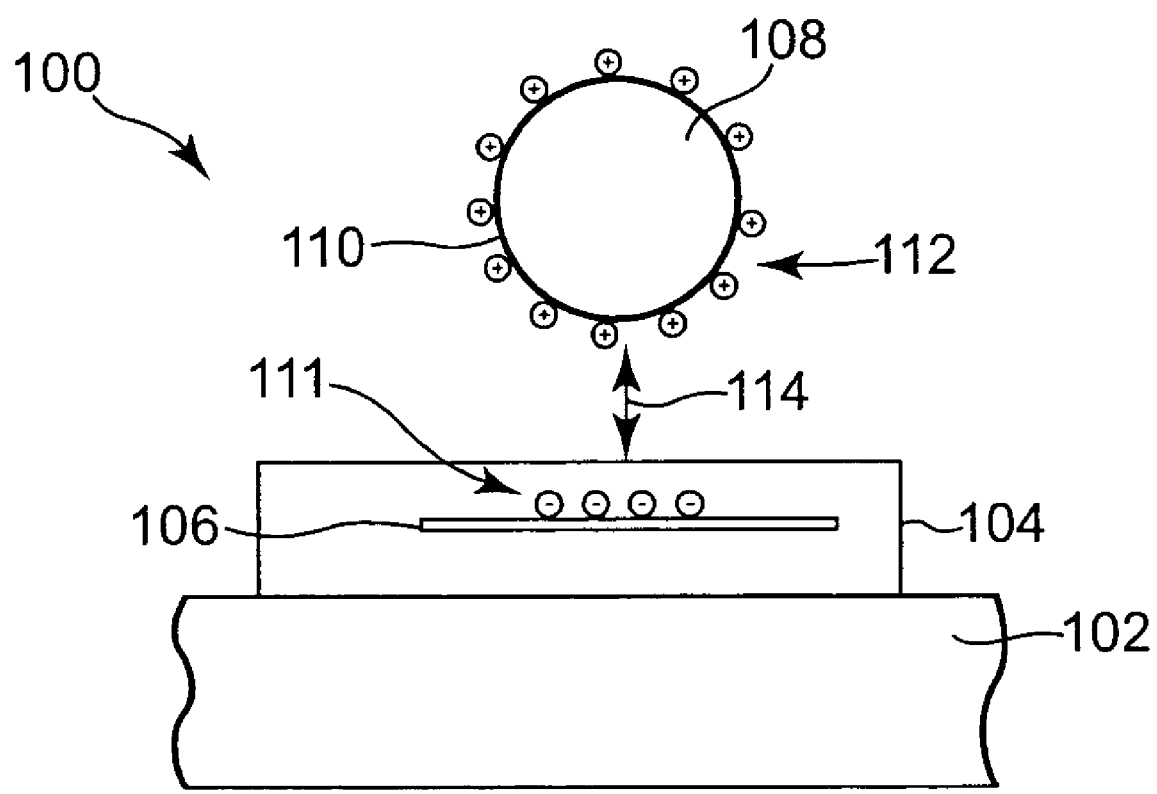
FIG. 1 schematically illustrates an embodiment of a MEMS-based device having an electret according to principles of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to MEMS actuator devices that use electrets for holding the position of at least one member relative to another member. Electret-controlled MEMS devices are particularly useful for maintaining constant the relative positions of different members of the MEMs device over a long period of time, and without the need for an external voltage source.

Electrets are the electrical analog of magnets and may be used to program actuators in a variety of electrostatically-biased MEMS devices. Most MEMS devices may be fabricated to close tolerances. Process controls may not be sufficient, however, to achieve desired levels of performance without some form of tuning or characterization. In addition, certain analog circuit applications require biasing or characterization in order to operate properly. In conventional circuits of this type, the characterization is done digitally by converting the appropriate analog setting using a D/A (digital-to-analog) converter. Alternatively, laser trimming is an option often employed on circuits but not directly on MEMS devices.

In the present invention, several approaches are presented that allow tuning of MEMS devices using electrets. These approaches reduce the need for stabilized, external bias circuits and for digital characterization and laser trimming.

FIG. 1 schematically shows a portion of MEMS device 100 having an electret. The base 102 is fixed, and has an insulating layer 104. The electret includes a floating electrode 106 disposed within the insulating layer 104. A movable member 108 has an electrode 110 on its outer surface and is disposed close to the floating electrode 106. The insulating layer 104 may be, for example, a layer of silicon dioxide, silicon nitride or the like, while the base and movable members 102 and 108 may be formed in silicon using MEMS micromachining techniques. The floating electrode 106 may be formed from a conducting material disposed within the insulator 104. The conducting material may be, for example, a metal, or a conducting semiconductor material. These materials are presented as examples of the types of materials that may be used in the device: there is no intent to restrict the invention to use of these exemplary materials. For example, the base and/or movable member may be made from quartz or sapphire.

When an electrical charge 111 is trapped on the floating electrode 106, an opposite charge 112 is induced on the electrode 110 of the movable member 108. The electrode 110 may be grounded. As a result of the induced charge 112, there is an attractive force 114 between the base 102 and the movable member 108. Typically, there is also a restoring force that acts against the attractive force. The restoring force may result from shearing or elastic forces that arise from movement of the movable member 108. The position of the movable member 108 relative to the base 102 is fixed when the restoring force cancels the attractive force. Since the charge 111 may stay trapped on the floating electrode for a long period, up to several years, the position of the movable member 108 relative to the base 102 may be held to be constant for a long period of time.

Various MEMS-based actuators may be controlled using electrets. One type of actuator where electrets are useful for controlling the relative positions of different members is on optical MEMS devices. For example, a MEMS-based actuator may have at least a first deflectable member and at least a second member, which may be fixed. There is at least a first floating electrode disposed on either the first deflectable member or the second member. The other of the first deflectable member and the second member is provided with a second electrode, for example a grounded electrode, or a second floating electrode. The charge on the first floating electrode is selected so as to position the deflectable member at a desired separation distance from the second member. A first optical element is provided with one of the deflectable member and the second member. A bias position of the first optical element relative to a second optical element is determined, at least in part, by the position of the deflectable member.

Figure 2:
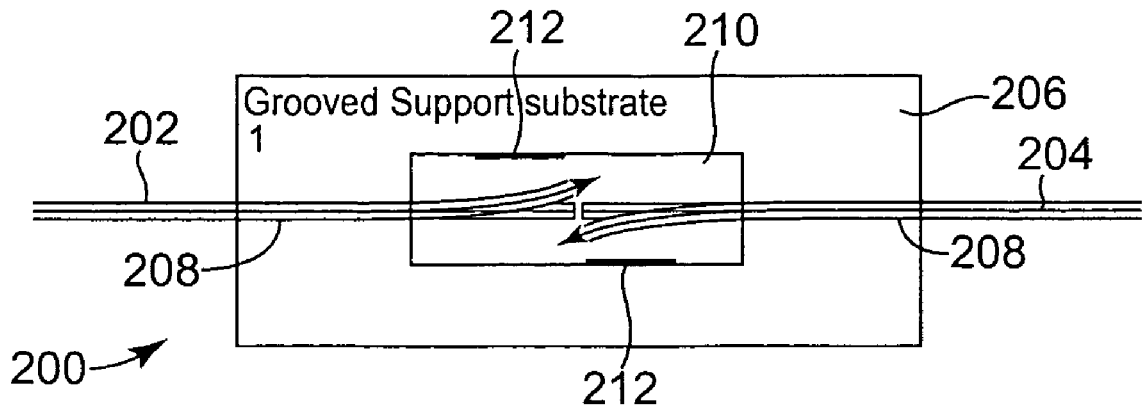
FIGS. 2 and 3 schematically illustrate an embodiment of a variable optical attenuator according to principles of the present invention.
Figure 3:
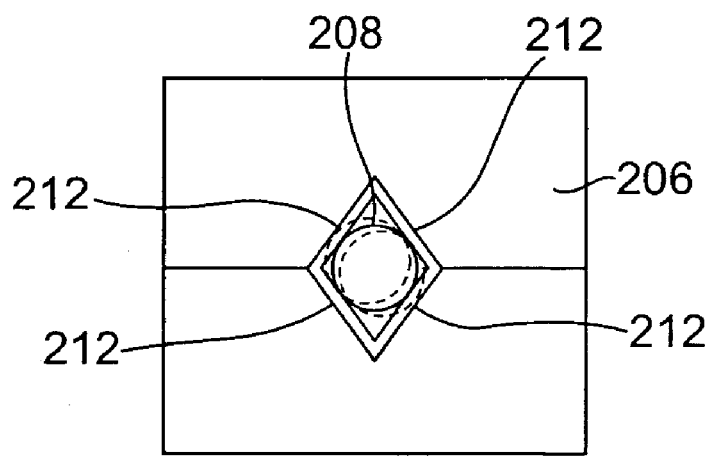

One example of such an optical MEMS-based device is a variable optical attenuator (VOA) 200 that uses two optical fibers optically coupled end-to-end. This is schematically illustrated in FIGS. 2 and 3. The first and second fibers 202 and 204 are held in a mount 206, with the end of at least one of the fibers 202 and 204 free to move. For good optical coupling (i.e., low insertion loss), the fibers 202 and 204 have their respective fiber cores aligned with each other. When it is desired to increase the loss, or attenuation, of the VOA 200, the end of at least one of the fibers 202 and 204 is deflected from the low loss position. The amount of attenuation is dependent on the degree of deflection: more deflection results in more attenuation.

In the illustrated embodiment, the mount 206 includes support grooves 208 that support the fibers 202 and 204, and an open region 210, also referred to as a cavity, that contains the ends of the fibers 202 and 204 that are deflectable. The VOA is described further in U.S. application Ser. No. 10/430,845, filed on May 6, 2003 and incorporated herein by reference.

Steering electrodes 212 are provided in the cavity 210 for the fibers 202 and 204 that move. In one particular embodiment of the VOA 200, there are four steering electrodes 212 provided per fiber 202 and 204. Appropriate bias voltages are provided on the different electrodes 208 in order to align the fibers for the lowest optical insertion loss, as occurs when the fiber cores are aligned. Once this nulling operation has been accomplished, an additional voltage may be applied to one or more electrodes to deflect one or both of the fibers 202 and 204 away from the low-loss aligned position so as to attenuate the optical signal passing between the fibers 202 and 204.

It is preferable that the charges established during the application of the bias voltages remain on the electrodes, so as to avoid having to drive the electrodes continuously following the establishment of the bias voltages. Schemes using active switches such as field effect transistors (FETs) to disconnect the electrodes after the bias voltages have been established are ineffective at providing long term isolation of the electrodes, due to the presence of charge leakage through the active switch. Leakage causes the bias voltages to change over short periods of time, typically on the order of minutes, causing the VOA 200 to become detuned.

Figure 4:
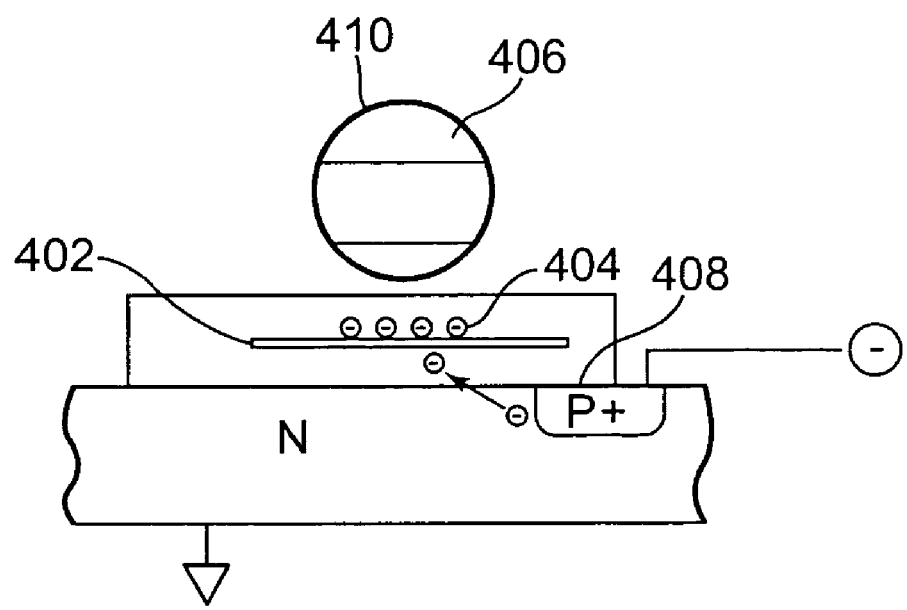
FIG. 4 schematically illustrates an embodiment of a floating electrode according to principles of the present invention.

One embodiment of an electret-based approach that may be used in the VOA is schematically illustrated in FIG. 4. The electret may use a floating electrode 402. A charge 404 placed on the floating electrode 402 is stable and does not leak from the electrode 402, since there is no direct electrical connection. The charge 404 may be placed onto the floating electrode 402 using one of several different methods. One common approach is a method called "hot electron" injection, whereby electrons are injected onto a floating electrode 402 by the application of an electric field and a diode 408 held in avalanche mode. Hot-electron charging is commonly used in non-volatile memory devices.

The fiber 406 is provided with a conducting second electrode 410, typically a thin metal film. The second electrode 410 may be grounded. Once a permanent charge 404 is trapped onto the floating electrode 402, an attractive force is exerted between the metal electrode-clad fiber 406 and the floating electrode 402, due to an image charge induced on the electrode 410. By varying the number of trapped charges, the attractive force can be changed.

During fabrication of the VOA 200, it is typically not known which direction the fibers 202 and 204 will have to be biased in order to achieve the low-loss condition. Therefore, the VOA structure may permit electret biasing along each of the four steering directions. The two fibers 202 and 204 are at least provided with sufficient floating electrodes to permit orthogonal movement, thus ensuring that the low-loss position can be achieved. The floating electrodes may be provided to only one fiber 202 or 204, or to both fibers 202 and 204. For changing the attenuation in the VOA, however, it is only necessary to provide one tunable electrode that deflects one of the fibers in one direction. It will be appreciated, however, that more than one tunable electrode may be provided, to one or both of the fibers 202 and 204.

Figure 5:
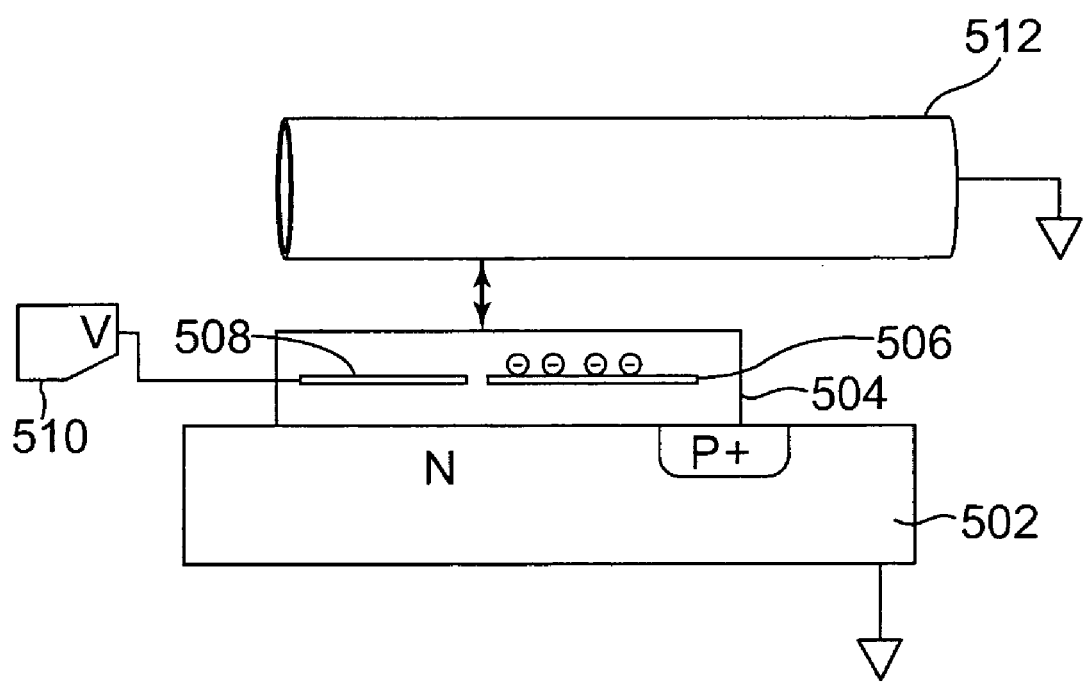
FIG. 5 schematically illustrates an embodiment of a floating electrode and a second electrode according to principles of the present invention.

An approach to providing both a floating electrode and a tunable electrode is shown schematically in FIG. 5. The base 502 has two electrodes disposed within a layer of insulator 504. A floating electrode 506 is used as an electret for long-term stabilization. Once the initial nulling operation is complete, the trapped charges remain on the floating electrodes 506. No further electrical activation is required except that used for changing the amount of attenuation.

A tunable electrode 508, also referred to as an active electrode, is provided for changing the amount of attenuation. The tunable electrode 508 is electrically coupled to a voltage supply 510. The tunable electrode may be provided in the same insulator 504 as the floating electrode 506.

There are two electrostatic forces between the base 502 and the fiber 512. One is due to the electrostatic force between the floating electrode 506 and the induced charge on the fiber 512. The other is due to the electrostatic force between the fiber 512 and the tunable electrode 508. Since the voltage on the tunable electrode 508 may be readily changed by changing the voltage applied via the voltage source 510, the total net electrostatic force applied to the fiber 512, and hence its position, may be changed.

By using the floating electrode technique, only one active electrode is needed for VOA operation, although more than one may be used. This simplifies the control circuit by reducing the number of controllable voltages per VOA from four down to one. It also helps unburden the voltage hold-up circuitry in the event of power loss. With regards to the optimum electrode configuration, more complicated patterns can be used. For example, the floating and tunable electrodes 506 and 508 may be interleaved and may also extend over the entire free length of the fiber 512.

Figure 6A:
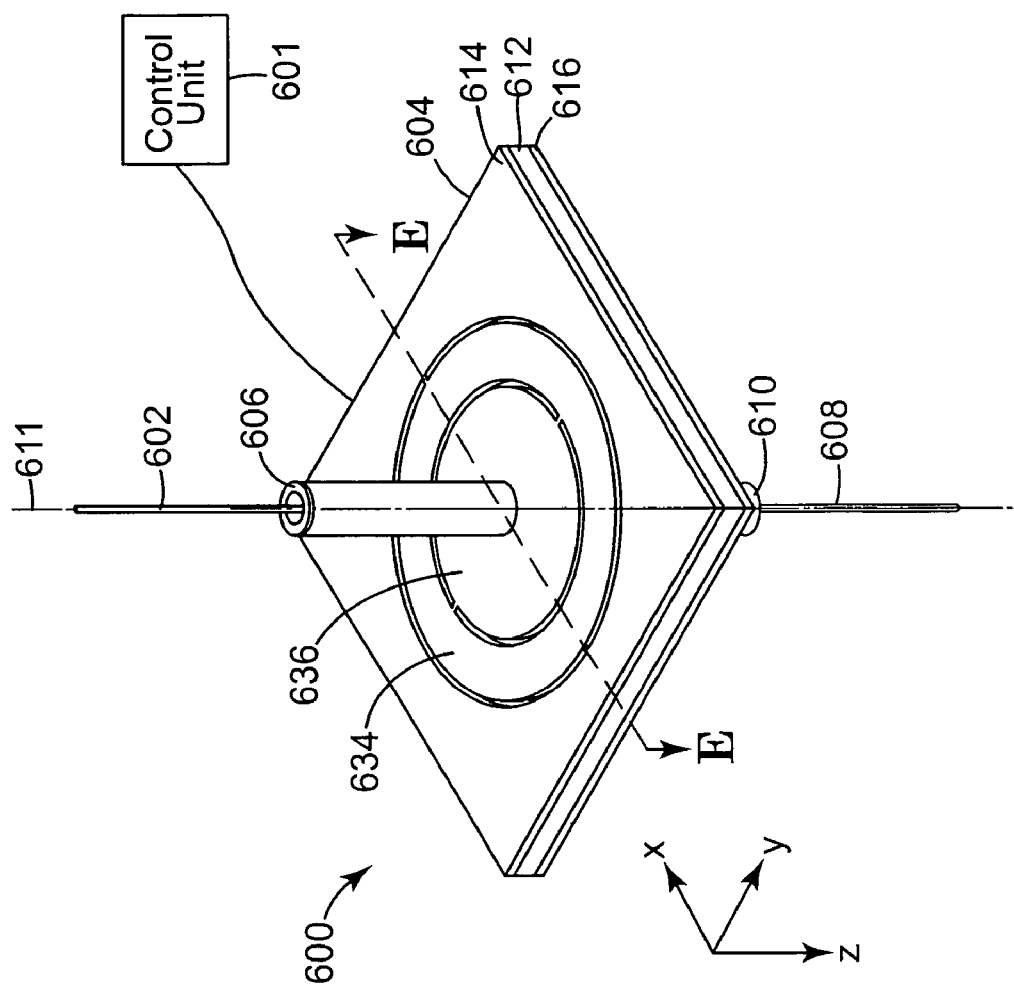
FIG. 6A schematically illustrates an embodiment of a tunable Fabry-Perot filter (TFPF) according to principles of the present invention.

Another type of optically activated MEMS device, a tunable Fabry Perot filter (TFPF), is now discussed with reference to FIG. 6A, which shows an embodiment of a TFPF 600. In this particular embodiment, the TFPF 600 is formed between reflecting surfaces formed on the opposing ends of two optical fibers. A first optical fiber 602 is attached to a first side of an actuator unit 604. The first fiber 602 may be terminated with a first ferrule 606 to provide increased stability and strength. A second fiber 608 is attached to the other side of the actuator unit 604. The second fiber 608 may also be provided with a terminating ferrule 610. The reflecting surfaces define a Fabry-Perot filter, also referred to as a resonator or cavity, that lies on the axis 611. The fibers 602 and 608 may be expanded core fibers, whose core is expanded towards the fiber end so that the light exiting the fiber has a divergence less than if the core was not expanded. A control unit 601 may be coupled to the TFPF 600 to control the operation of the TFPF 600.

In this particular embodiment, the actuator unit 604 comprises three elements, a center element 612, a second element 614 and a third element 616, schematically illustrated in FIGS. 6B–6E. A cross-sectional view through the device 600 is provided in FIG. 6F. The center element 612 is used as a stationary base, also referred to as a stationary member, on which the second and third elements 614 and 616 are mounted. The center element 612 provides electrical elements used in actuating the alignment mechanism provided on the second element 614 and the displacement mechanism provided on the third element 616.

Figure 6B:
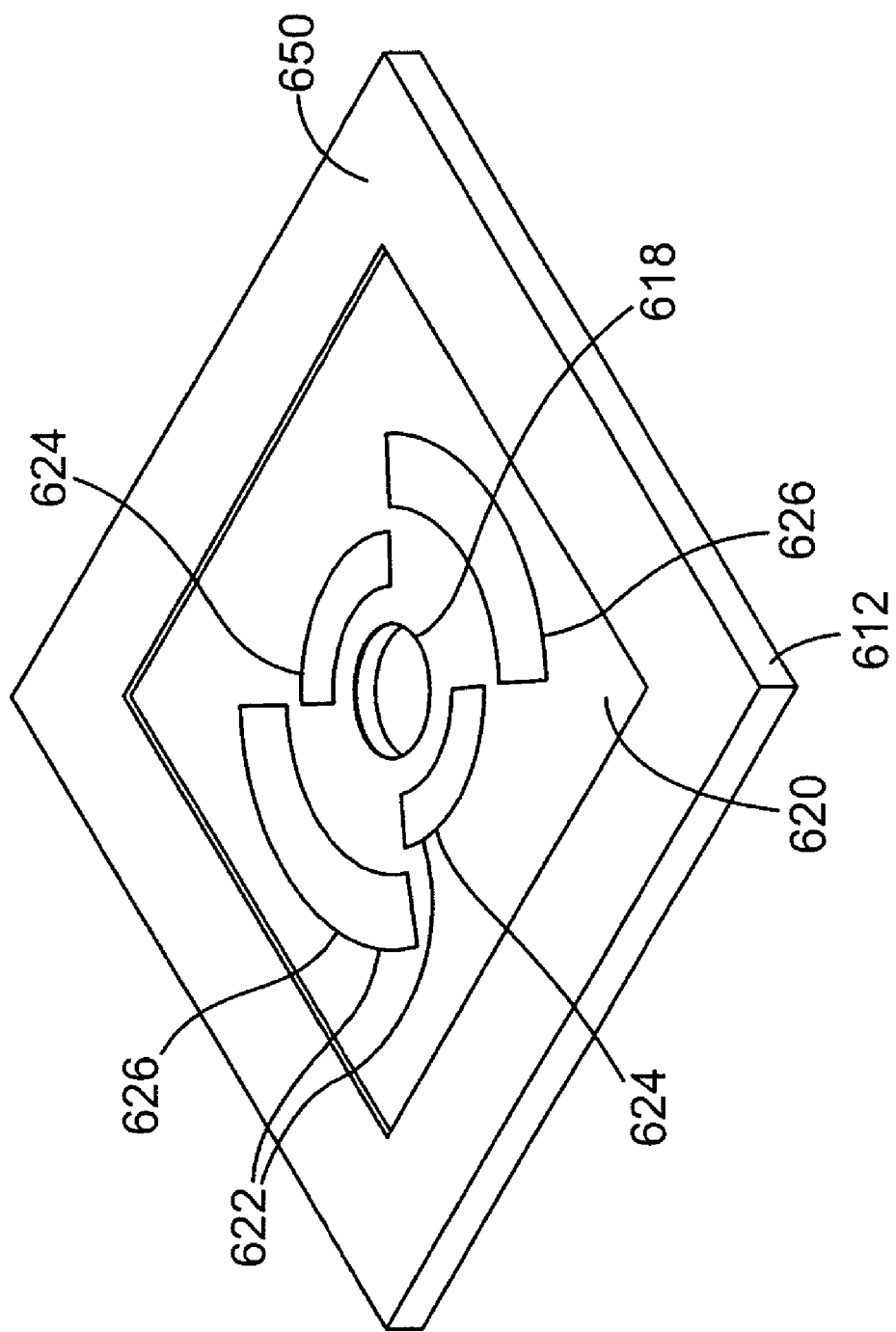
FIGS. 6B–6E schematically illustrate embodiments of component parts of the TFPF illustrated in FIG. 6A.
Figure 6C:
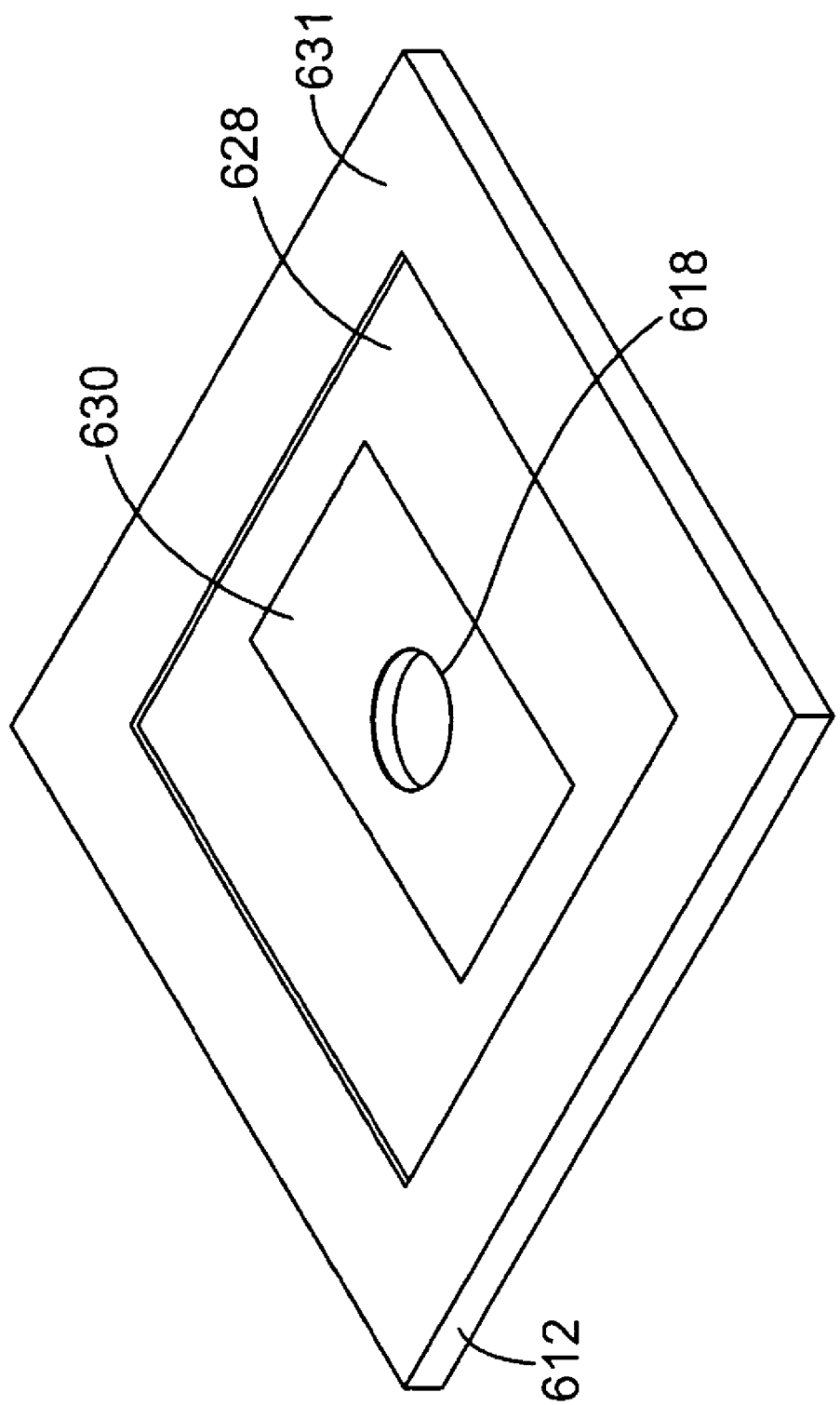

Referring now specifically to FIG. 6B, which shows one side of the central element 612, there is an aperture 618 through which light passes between the fibers 602 and 608. The first surface 620 includes a pattern of floating electrodes 622, or electrets. The pattern of floating electrodes 622 may include a set of x-electrodes 624 for providing rotational alignment of the fiber 602 in the x-z plane and a set of y-electrodes 626 for providing rotational alignment of the fiber 602 in the y-z plane. The second surface 628 of the central element 612 on the other side from the first surface 620, illustrated in FIG. 6C, is provided with a set of one or more displacement electrodes 630 for controlling the separation between the end of the second fiber 608 and the end of the first fiber 602. The set of one or more displacement electrodes 630 is illustrated as having only one electrode, but it will be appreciated that multiple electrodes may be used.

Figure 6D:
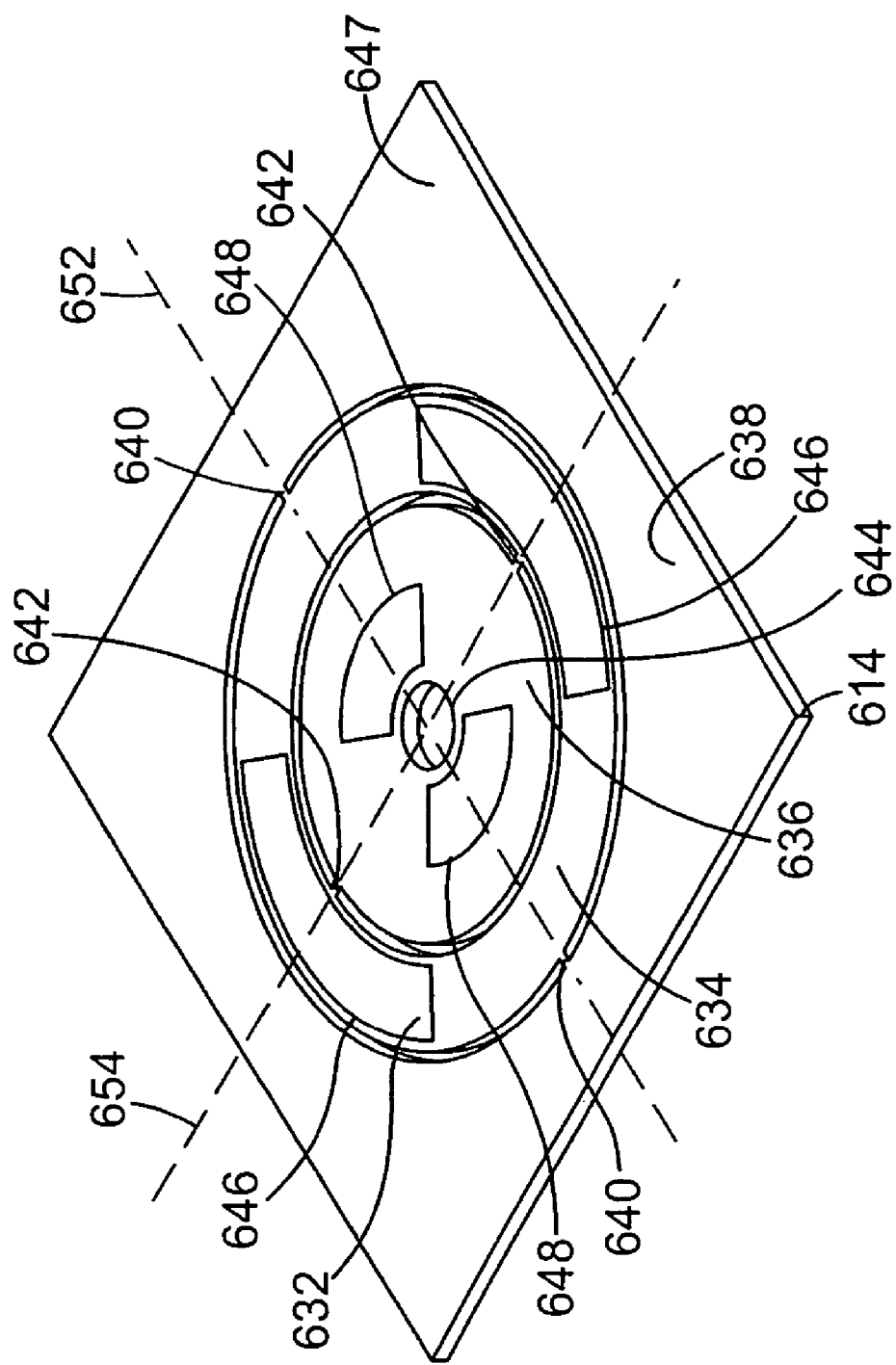

Referring now to FIG. 6D, the second element 614, which opposes the first surface 620 of the central element 612, includes a rotational alignment mechanism 632. In this particular embodiment, the rotational alignment mechanism 632 comprises two concentrically mounted sections 634 and 636 contained within a collar 638. The outer section 634 is attached to the collar 638 by two hinges 640 formed by thin sections of material. The inner ring 636 is attached to the outer ring by two hinges 642, also formed by thin sections of material. An aperture 644 in the inner section 636 permits passage of light between the two optical fibers 602 and 608. The second element may be fabricated using, for example, silicon. The alignment mechanism is used to align the end of one of the fibers to the end of the other fiber so as to align the Fabry-Perot cavity.

The outer section 634 is provided with two y-second electrodes 646 and the inner section 636 is provided with two x-second electrodes 644. The second element 614 is mounted by attaching its surface 648 to the mounting surface 650 of the central element 612, so that the floating x-electrodes 624 of the central element 612 oppose the x-second electrodes 648 of the second element 614 and the floating y-electrodes 626 of the central element 612 oppose the y-second electrodes 646 of the second element 614. The second and the third elements 614 and 616 may be attached to the central element 612 using any suitable technique, for example, soldering, fusing or bonding. The maximum alignment in x-z and y-z planes may be of the order of one or two degrees of rotation, or more.

The alignment mechanism 632 operates as follows. Various control voltages may be applied to the floating x-electrodes 624 and 648 to control the orientation of the first fiber 602 in the x-z plane. The inner section 636 can be rotated about the axis 654 formed by the two hinges 642 by adjusting the control voltages applied to the floating x-electrodes 624 so as to provide an electrostatic force about the axis 654. Likewise, control voltages may be applied to the floating y-electrodes 626 to control the orientation of the first fiber 602 in the y-z plane. The outer section 634 can be rotated about the axis 652 formed by the two hinges 640 by adjusting the control voltages applied to the y-electrodes 626 so as to provide an electrostatic force about the axis 652.

Figure 6E:
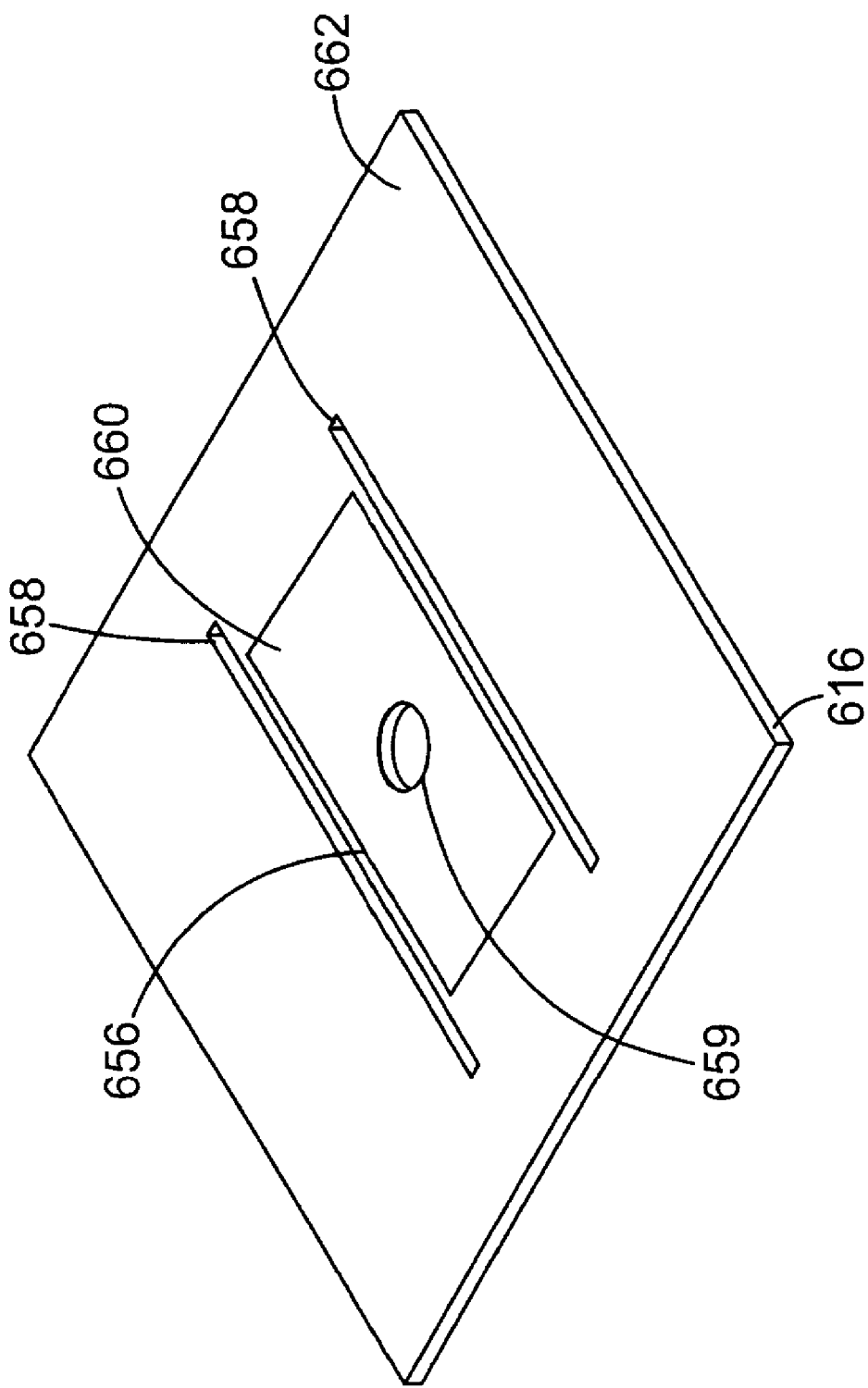
Figure 6F:
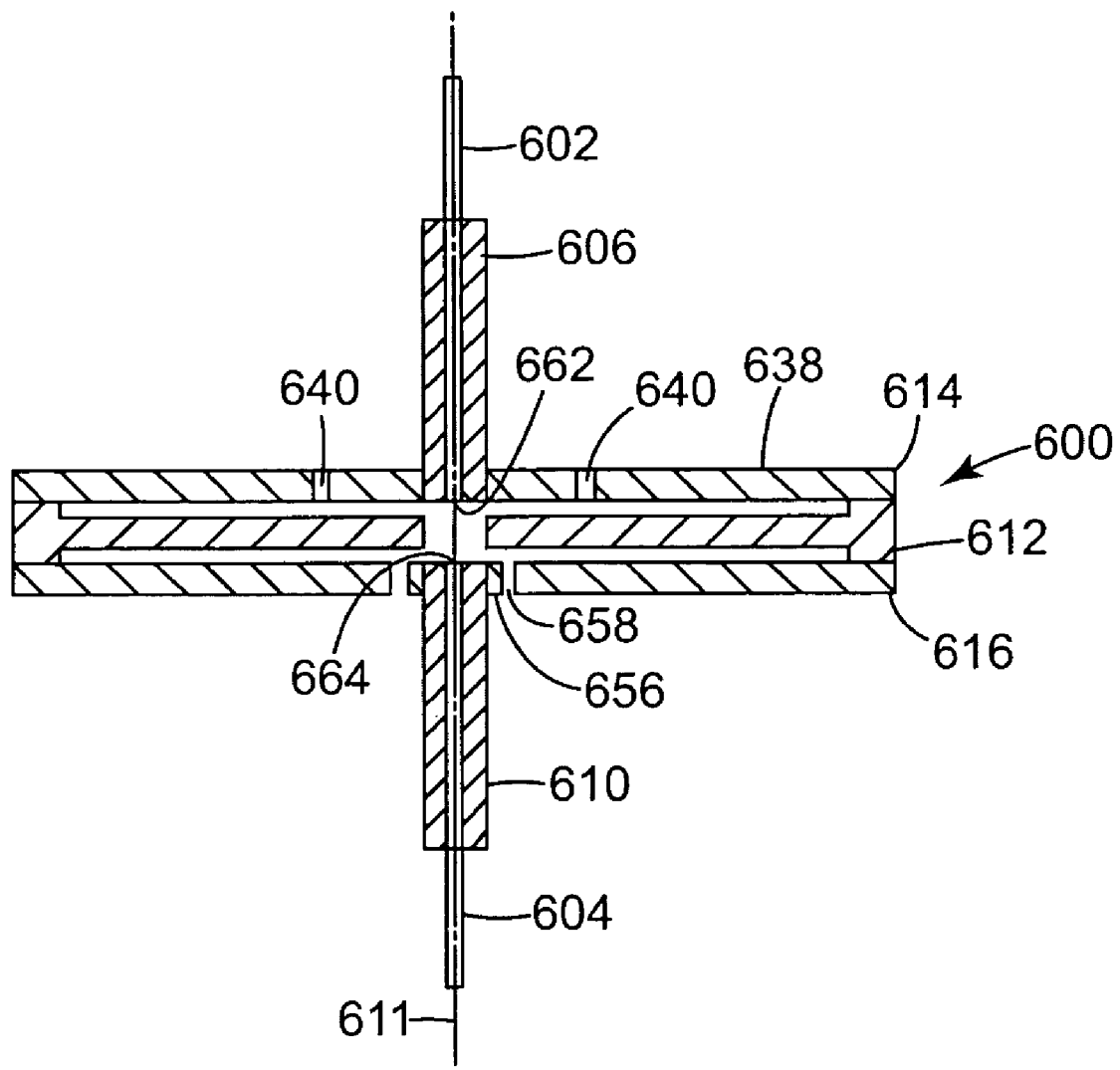

Referring now to FIG. 6E, the third element 616 is provided with a flexible member 656 that permits z-translation so as to tune the Fabry Perot cavity formed between the two fibers 602 and 608. In the illustrated embodiment, the flexible member 656 is a beam member, formed by cutting two parallel slots 658 in the third element 616. An aperture 659 provided in the beam member 656 permits the light to pass between the first and second fibers 602 and 608. The beam member 656 is provided with one or more electrodes 660 that correspond to the electrodes in the set of electrodes 630 provided on the central element 612. The surface 662 of the third element is attached to the mounting surface 631 of the central element 612 with the electrode 660 opposing the set of electrodes 630.

The separation between the ends 662 and 664 of the fibers 602 and 608 may be varied by adjusting control voltages applied to the electrodes 630 and 660. The z-separation between the ends 662 and 664 of the fibers 602 and 608 can be reduced by applying voltages of different polarity to the electrodes 630 and 660, making the beam member 656 flex towards the central element 612.

The different elements 612, 614 and 616 may be formed from any suitable type of material. One particularly suitable type of material is silicon and the various features on the elements may be formed using standard lithographic and etching techniques. One advantage of using silicon is that the beam member may be formed in a single crystal, with the attendant physical properties of single crystals.

The TFPF 600 may be aligned and operated in the following manner. Once the actuator unit 604 has been assembled with the first and second fibers 602 and 608, an optical test signal is passed from one of the fibers to the other. The optical signal may be outside the preferred wavelength range of operation of the TFPF, so that the reflectivity of the reflective surfaces of the TFPF is reduced. Furthermore, the test signal may have a bandwidth broader than the FSR of the TFPF. The rotational alignment between the fibers 602 and 608 may be adjusted by controlling the voltages on the floating x-electrodes and y-electrodes 624 and 626 on the center element 612 so as to maximize the amount of light passed between the fibers 602 and 608. Once the optimal orientation has been found for the first fiber 602, the floating x-electrodes and y-electrodes 624 and 626 maintain constant charge, and thus maintain a fixed alignment between the fibers 602 and 608.

Once the fibers 602 and 608 have been aligned, the separation distance between the fiber ends 662 and 664 may be adjusted by controlling the voltage applied to the displacement electrodes 630 and 660 to achieve a desired resonant transmission frequency. The applied voltages may be held fixed to maintain the desired separation between the fibers 602 and 608.

The control unit 601 may be used to apply specific voltages to the floating x-electrodes 624, the floating y-electrodes 626 and/or the displacement electrodes 630 and 660. The control unit may also be used to measure a value of capacitance between the electrets. For example, the x-electrets 624 and 648 form a capacitor whose value, referred to as x-capacitance, may be measured and stored by the control unit. The control unit may stabilize the value of the x-capacitance by controlling the charge on the x-electrets 624 and 648, in the event that there is any charge leakage. Stabilizing the capacitance ensures that the x-electrets are maintained at a constant physical separation, thus maintaining constant the alignment of the fiber 602 in the x-z plane. Accordingly, the maintenance of constant x-capacitance and constant y-capacitance permits the orientation of the fiber 602 to be kept constant, without the use of optical feedback. Likewise, the measurement and stabilization of the displacement electrodes 630 and 660, may permit the TFPF to be stabilized at a selected frequency of peak transmission.

It will be appreciated that one or more of the x-electrets and y-electrets may be replaced by, or supplemented with, conventional electrodes. Furthermore, electrets may be used to stabilize the z-separation between the fibers 602 and 608 if the long term separation distance between the fibers 602 and 608 is to be kept constant.

This embodiment of the TFPF and other embodiments are described in further detail in U.S. patent application Ser. No. 10/425,509, filed on Apr. 29, 2003, and incorporated herein by reference.

Figure 7:
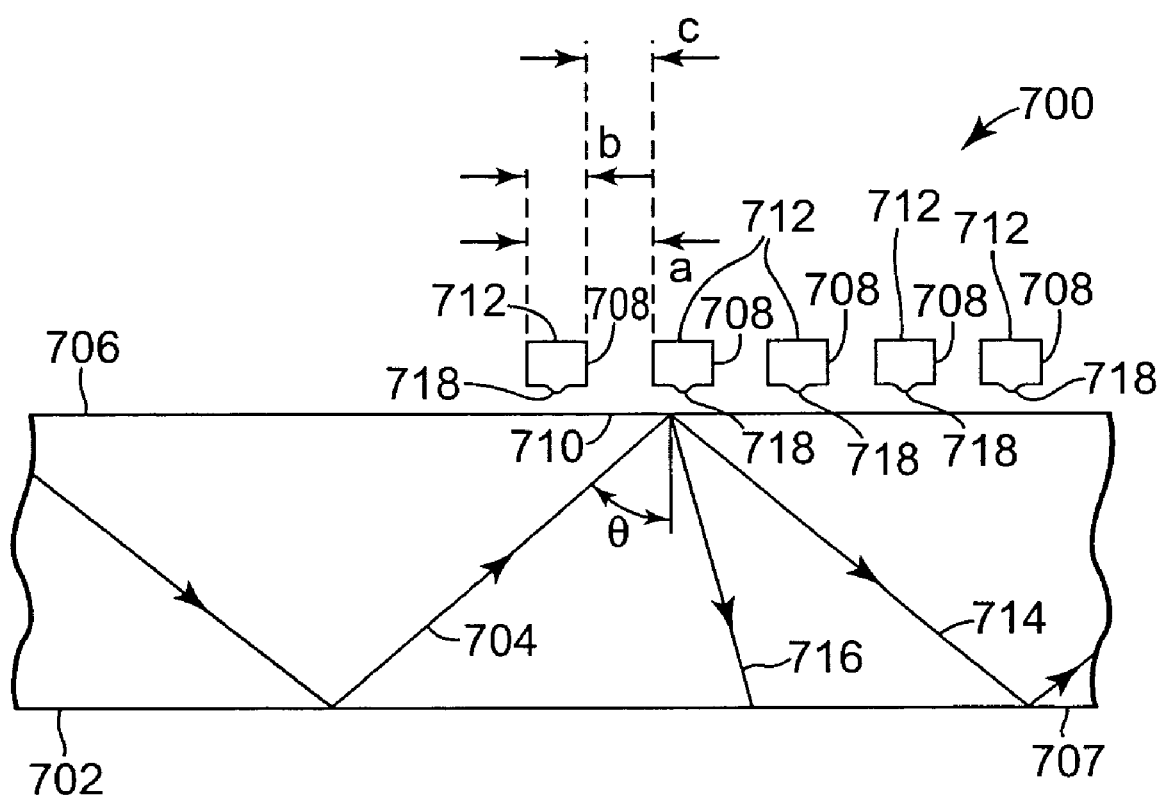
FIG. 7 schematically illustrates an embodiment of a grating-based optical switch according to principles of the present invention.

Another type of MEMS actuator that is used in an optical device is an optical switch based on a holographic optical element (HOE), now discussed with reference to FIGS. 7 and 8 and further described in U.S. patent applications Ser. No. 109/905,736 and 09/905,769, filed on Jul. 13, 2001 and incorporated herein by reference.

The switch 700 has a substrate 702 along which light 704 travels by internally reflecting off the two substrate surfaces 706 and 707. An HOE 709 is disposed above one surface 706 of the substrate 702. The HOE 709 comprises a number of material strips 708. In the illustrated embodiment, the strips 708 each have a width of b, and have a separation of c, and a center-to-center spacing of a. The HOE 709 is movable in a vertical direction relative to the top surface 706 of the substrate. When the HOE 709 is moved close to, or in contact with, the surface 706, light 704 striking the surface 706 is diffracted along path 716, through physical or evanescent interaction with the HOE 709. When the HOE 709 is moved away from the surface 706, there is no optical coupling between the light 704 and the HOE 709, and so the light 704 is internally reflected along the path 714.

The strips 708 need not be in contact with the surface 706 when in the diffracting position, but may be spaced apart from the surface 706. In fact, under certain conditions, the diffraction efficiency along direction 716 may be maximized when there is a gap of the order of 100 nm between the HOE 709 and the surface 706.

The light 704 internally reflects within the substrate 702 so as to propagate within a propagation plane that is parallel to the figure. The strips 708 may be set to be non-perpendicular to the propagation plane so that the light 716 is diffracted out of the plane of the figure. The diffracted light 716 may also internally reflect within the substrate, if the angle of incidence of the diffracted light 716 on the substrate surfaces 706 and 707 is higher than the critical angle. The strips 708 may be provided with small bumps 718 on their lower surfaces to reduce the possibility of the strips 708 sticking to the surface 706 when in contact with the surface 706.

Figure 8:
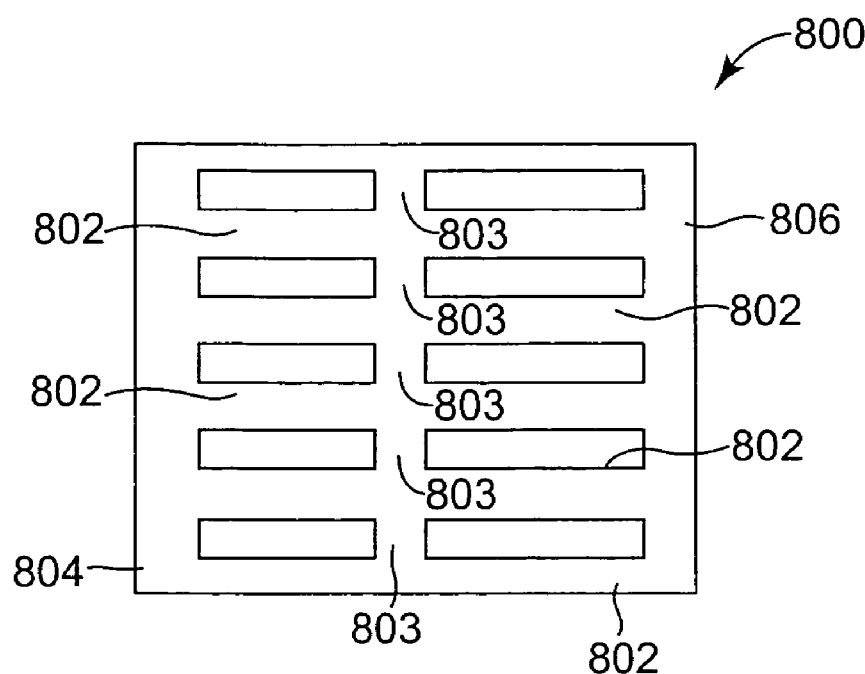
FIG. 8 schematically illustrates an embodiment of a holographic optical element that may be used in the optical switch of FIG. 7.

An exemplary HOE 800 is schematically illustrated in FIG. 8. The HOE 800 includes strips 808 and cross-sections 803 to provide support to the strips. Side portions 804 and 806 provide additional support to the HOE 800. The strips 808, cross-sections 803 and sides 804 and 806 may all be formed from the same material, and may be formed using lithographic techniques.

Figure 9:
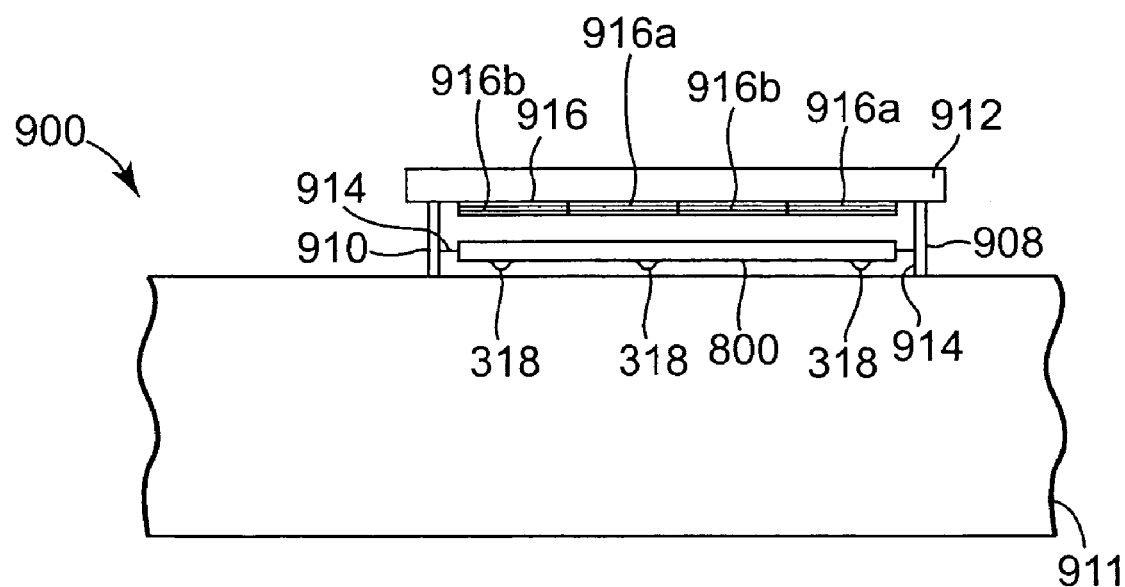
FIG. 9 schematically illustrates an embodiment of an optical switch that is controlled using an electret, according to principles of the present invention.

One approach for actuating the HOE 800 is schematically illustrated in FIG. 9. A mounting structure has two mounting bases 908 and 910 formed on a substrate 911 and a mounting plate 912 formed on bases 908 and 910. The HOE 800 is coupled to the mounting bases 908 and 910 via flexible connections 914. The flexible connections 914 may be any suitable type of MEMS processed springs or structures allowing flex, at least in a vertical direction. The flexible connections 914 may also allow bi-directional, up and down deflection. An electrode structure 916 is mounted to the mounting plate 912 and, in this embodiment, extends transversely and longitudinally across the strips, which may be grounded. In such a configuration, the HOE 800 may be biased in the "on" position and moveable to an "off" position, further away from the substrate 911, under an electric field from the electrode 916. Alternatively, the HOE 800 may be biased in the "off" position and moved to the "on" position, closer to the substrate 911.

The electrode structure 916 may include a floating electrode 916a that is used for biasing the HOE 800 by injecting a specified amount of charge to achieve a desired stand-off distance between the HOE 800 and the substrate 911. A tunable electrode 916b may be used for rapid actuation of the HOE between the "on" and "off" positions. The floating electrode 916a and tunable electrode 916b may be interleaved so as to achieve a more uniform application of the biasing force and the tuning force to the HOE 800. Thus, the device 900 may be biased to a desired bias position using an electret and may be activated using an active electrode. This configuration provides long-term bias stability and reduces the need for active voltage control for long term position control.

In addition to optically-based MEMS devices, electrets may be used for long term positioning of flexible members in electrical MEMS devices. Such a device may include a MEMS-based actuator having at least a first deflectable member and at least a second member. A first floating electrode is disposed on one of the first deflectable member and the second member. A second electrode is provided on the other of the first deflectable member and the second member. A charge stored on the first floating electrode is selected so as to position the deflectable member at a desired separation distance from the second member. Either the deflectable member or the second member, or both, comprises an electrical element having an electrical characteristic that is dependent on a position of the first deflectable member relative to the second member.

Figure 10:
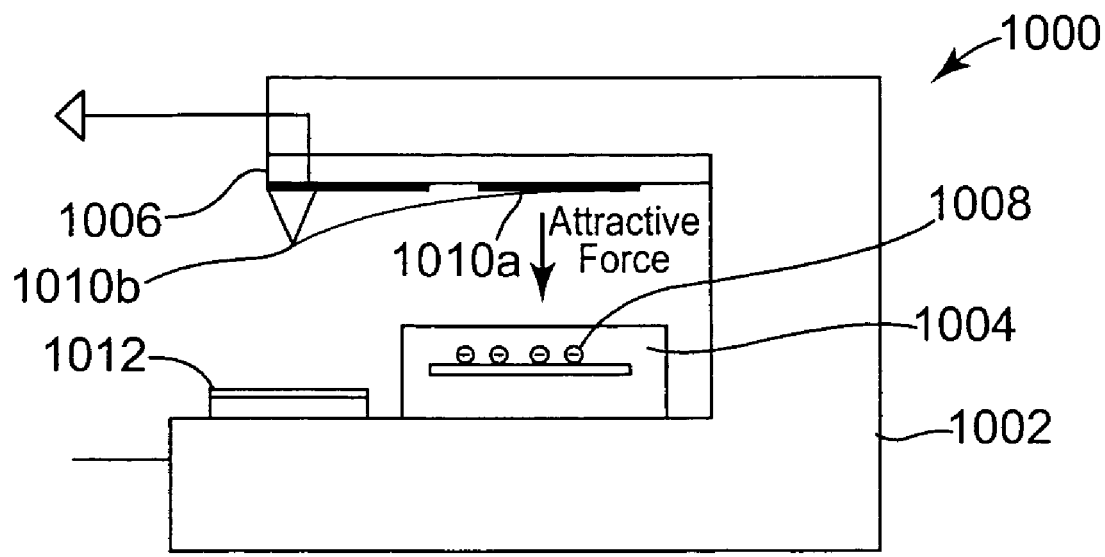
FIG. 10 schematically illustrates an embodiment of a MEMS-based tunable capacitor according to principles of the present invention.

One example of such a device is schematically illustrated in FIG. 10, which shows an embodiment of a MEMS-based tunable capacitor 1000. The capacitor 1000 has a base 1002 and a floating electrode 1004 formed on the base 1002. There is a deflectable member 1006 opposing the floating electrode 1004, whose amount of deflection is dependent on the amount of charge stored 1008 in the floating electrode 1004. At least one electrode is disposed on the flexible member 1006. In the illustrated embodiment, there are two electrodes 1010a and 1010b on the deflectable member 1006. The first deflectable member electrode 1010a is a second electrode associated with the floating electrode 1004, and may be grounded. Charge on the floating electrode 1004 induces a mirror charge on the first deflectable member electrode 1010a and creates an attractive force that deflects the deflectable member towards the floating electrode 1004.

A capacitor is formed between the second deflectable member electrode 1010b and a capacitor electrode 1012. The capacitance of the capacitor 1000 is determined, at least in part, by the spacing between the second deflectable member electrode 1010b and the capacitor electrode 1012. Therefore, as the amount of charge placed on the floating electrode 1004 is changed, the separation between the second deflectable member electrode 1010b and the capacitor electrode 1012 is changed, and thus the capacitance changes.

This type of device may be useful as a tunable or programmable capacitor in an electronic circuit, and may be used in place of the conventional "digital" approach of programmable capacitors that employs a bank of discrete capacitors that are switched in parallel or series to obtain various net values of capacitance. This approach is inherently limited in its capability to achieve high resolution, due to the discrete switching. In contrast, the electret-tunable, MEMS-based capacitor 1000 is continuously variable and may provide higher resolution in the value of capacitance achieved than the conventional digital approach, with the resolution limit being the change in capacitance that arises when one electron is added to the floating electrode 1004. An electret-tunable, MEMS-based capacitor 1000 may be used, for example, in tuning a programmable operational amplifier gain stage, or some other capacitively tuned circuit.

It will be appreciated that various modifications may be made to the capacitor 1000 while still falling within the scope of the invention. For example, the electrodes 1010a and 1010b may be replaced with a single, grounded electrode. The capacitance of the capacitor 1000 would, in such a case, be a result of the electrical interaction between the grounded electrode and the capacitor electrode 1012. Other variations are also possible. For example, the floating electrode may be positioned on the deflectable member 1006 and the grounded electrode may be disposed on the base 1002.

Figure 11:
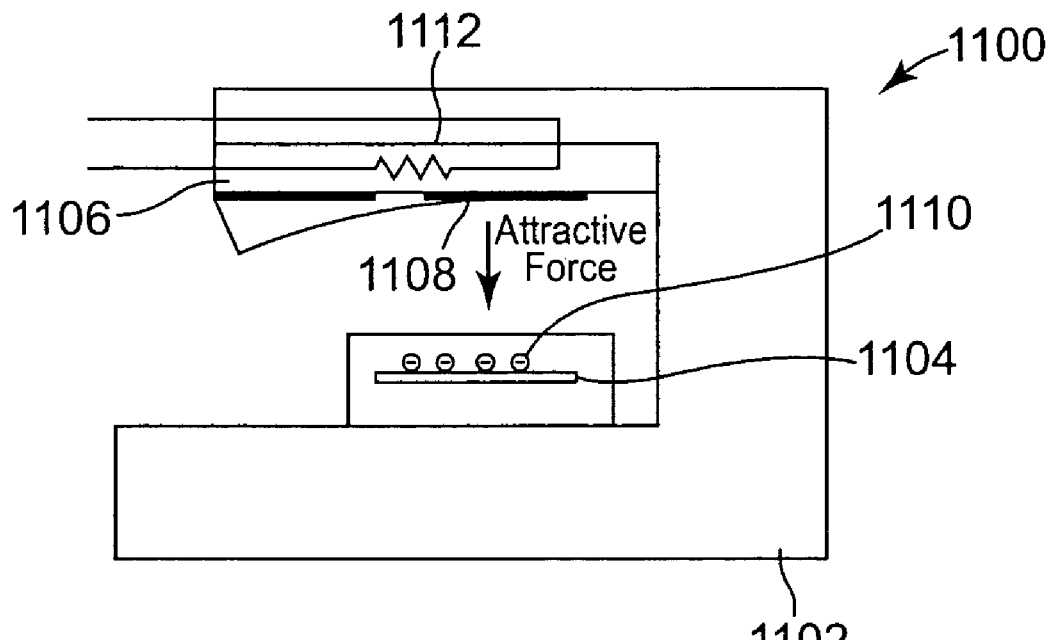
FIG. 11 schematically illustrates an embodiment of a MEMS-based tunable resistor according to principles of the present invention.

Another MEMS-based electrical device that uses an electret-based actuator is a programmable resistor 1100, now described with reference to FIG. 11. In this particular embodiment, the resistor 1100 is formed with a floating electrode 1104 on a base 1102. Opposing the floating electrode 1104 is a deflectable member 1106 that carries an electrode 1108 that may be grounded. Placement of charge 1110 on the floating electrode 1104 induces a mirror charge on the electrode 1108, resulting in an attractive force between the floating electrode 1104 and the electrode 1108. Consequently, the deflectable member 1106 deflects towards the floating electrode 1104.

A strain-sensitive resistor 1112 is disposed on the deflectable member 1106. The amount of strain applied to the strain sensitive resistor 1112 is dependent, on the amount by which the deflectable member 1106 deflects, and so the amount of charge 1110 on the floating electrode 1106 controls the resistance of the strain-sensitive resistor 1112. Accordingly, the resistance of the tunable resistor 1100 may be controlled and set to a desirable level. The long term, low-leakage characteristics of the floating electrode result in the value of the resistance being held stable for long periods of time.

A tunable resistor 1100 may be used to replace the conventional "digital" method of providing a tunable resistance, where multiple resistors are switched in series and parallel to achieve a desired value of resistance. The MEMS-based tunable resistor 1100 provides high resolution in the tuned resistance value, since the resolution is continuously variable, being limited only by the change in resistance resulting from the addition of a single electron to the floating electrode 1104.

Figure 12:
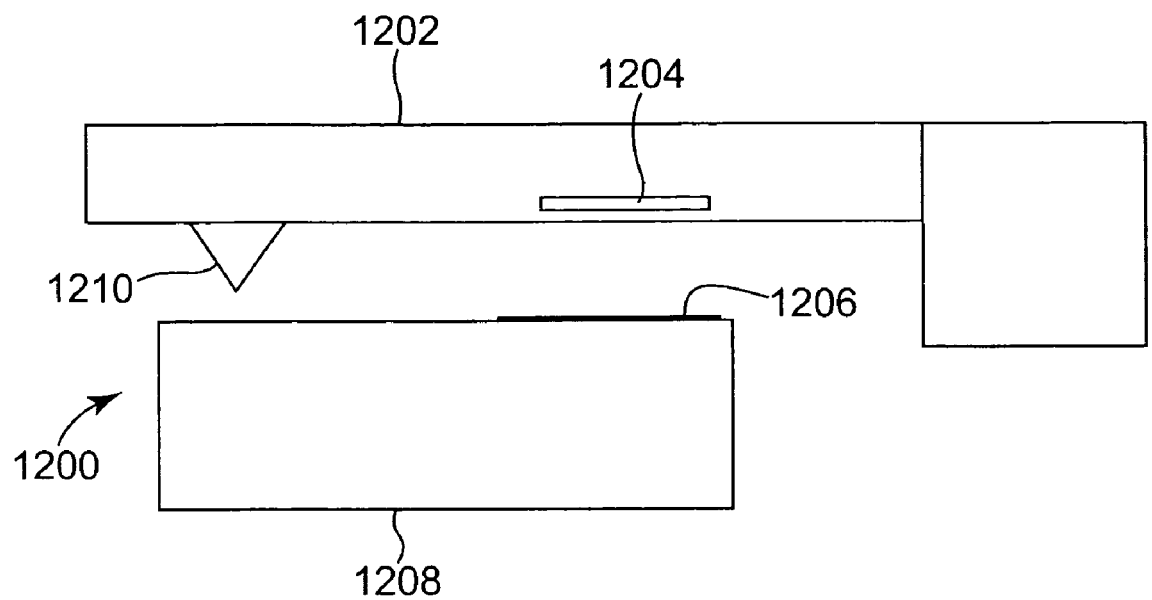
FIG. 12 schematically illustrates an embodiment of an electron tunneling current detector according to an embodiment of the present invention.

An electret may also be used in an actuator in a MEMS-based sensor, where the electret does not form the detection mechanism, but is used to position part of the device relative to another part of the device. One example of such a device is schematically illustrated in FIG. 12, which shows an electron tunneling detector device 1200, for example as may be used in a scanning tunneling electron microscope. The device 1200 includes a deflectable arm 1202 which includes a floating electrode 1204. A second electrode 1206 is positioned on a substrate 1208. The second electrode 1206 may be grounded, so that when charge is placed on the floating electrode 1204, an image charge is induced in the second electrode 1206, resulting in an attractive force between the deflectable arm 1202 and the substrate 1208. A tunneling tip 1210 is also positioned on the deflectable arm 1202, for detecting a tunneling current from a sample. Thus, the position of the tunneling tip 1210 relative to the substrate 1208 may be controlled by the amount of charge on the floating electrode 1204.

Figure 13:
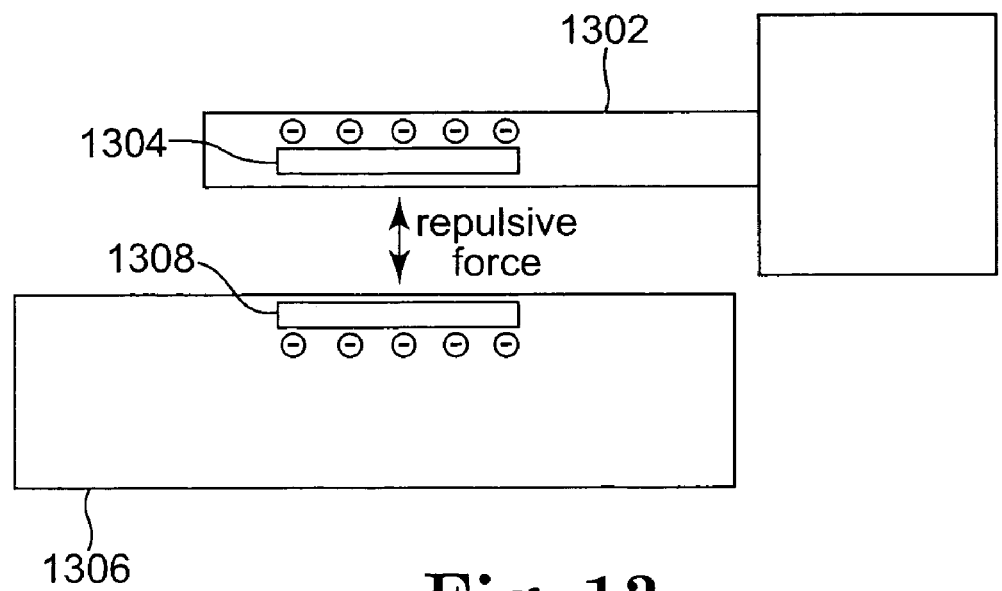
FIG. 13 schematically illustrates an embodiment of an electret-controlled MEMS-based device according to principles of the present invention.

It will be appreciated that electrets need not only use floating electrodes in conjunction with grounded electrodes, but that other combinations may also be used. For example, two floating electrodes may be used, with the same types of charge carrier applied to the two floating electrodes to create a repulsive force rather than an attractive force. An example of this is schematically illustrated in FIG. 13, where a deflectable member 1302 includes a first floating electrode 1304 and a substrate 1306 includes a second floating electrode 1308. The placement of like charges on the two floating electrodes 1304 and 1308 results in a repulsive force, and so the deflectable member 1302 is deflected away from the substrate 1306. Of course, opposite charges may be placed on opposing electrets to create an attractive force.

Electrets may be used to pre-bias a variety of other types of MEMs devices so as to have them reside in a known state in the absence of applied power. For example, the VOA described above may be made to have a large offset in its unpowered state. An optical switch may also be made to be either in a normally OFF or ON state, the desired state being under program control without the need for different mechanical configurations at the time of assembly. In fact, any MEMS device which has some form of electrostatic displacement may employ an electret to produce an unpowered bias state that is stable over the long term.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed. The claims are intended to cover such modifications and devices.

I claim:

1. A MEMS-based optical device, comprising:
a MEMS-based actuator having at least a first deflectable member and at least a second member, at least a first floating electrode disposed on one of the first deflectable member and the second member, the other of the first deflectable member and the second member being provided with a second electrode, a charge on the first floating electrode being selected so as to position the deflectable member at a desired separation distance from the second member;
one of the deflectable member and the second member comprising a first optical element; a bias position of the first optical element relative to a second optical element being determined, at least in part, by the position of the deflectable member.

2. A device as recited in claim 1, wherein the deflectable member comprises the first optical element.

3. A device as recited in claim 1, wherein the deflectable member is a first optical fiber having a first end.

4. A device as recited in claim 3, wherein the second optical element is a second optical fiber having a second end opposing the first end of the first optical fiber, a position of the first optical fiber transverse to the second optical fiber being determined, at least in part, by the charge on the first floating electrode.

5. A device as recited in claim 4, wherein the first optical fiber comprises a first grounded electrode and the second member comprises a frame having the first floating electrode and at least a second floating electrode, electrical charges on at least the first and second floating electrodes determining a position of the first optical fiber relative to the frame.

6. A device as recited in claim 5, wherein the second optical fiber comprises a second grounded electrode, and the frame comprises at least third and fourth floating electrodes, electrical charges on the third and fourth floating electrodes determining a position of the second optical fiber relative to the frame.

7. A device as recited in claim 5, further comprising a tunable electrode on the frame, and electric charge stored on the tunable electrode also determining, at least in part, the position of the first optical element relative to the second optical element.

8. A device as recited in claim 1, wherein the deflectable member comprises a holographic optical element (HOE).

9. A device as recited in claim 8, wherein the second member comprises a frame, the floating electrode being provided on the frame and the HOE comprising a grounded electrode.

10. A device as recited in claim 8, wherein the second optical element is an optically transparent substrate with first and second surfaces, light totally internally reflecting within the optically transparent substrate at the first and second surfaces.

11. A device as recited in claim 10, further comprising a tunable electrode, wherein a bias position of the HOE is determined by the charge stored on the floating electrode when there is no charge on the tunable electrode, the HOE moving to a switched position when there is charge on the tunable electrode.

12. A device as recited in claim 1, wherein the device comprises a tunable Fabry Perot filter formed by two optically reflecting surfaces, at least one of the optically reflecting surfaces being disposed on an aligning member for alignment relative to the other reflecting surface so as to form a Fabry-Perot resonator therewith, the aligning member comprising the deflectable member, with at least one of the optically reflecting surfaces disposed on the aligning member comprising the first optical element.

13. A device as recited in claim 12, wherein at least one of the two optically reflecting surfaces comprises an end of an optical fiber.

14. A device as recited in claim 12, further comprising a flexible member, one of the optically reflecting surfaces being mounted so as to be movable along a filter axis when the flexible member flexes, so as to change a separation distance between the optically reflecting surfaces.

15. A device as recited in claim 1, wherein the deflectable member comprises a mirror.

16. A device as recited in claim 1, further comprising a hot electron injector provided to inject electrons to the first floating electrode.

17. A device as recited in claim 1, wherein the optical device is formed, at least in part, from silicon.

18. A device as recited in claim 1, wherein the optical device is formed, at least in part, from quartz.

19. A device as recited in claim 1, wherein the optical device is formed, at least in part, from sapphire.

20. A MEMS-based electrical device, comprising:
    a MEMS-based actuator having at least a first deflectable member and at least a second member, at least a first floating electrode disposed on one of the first deflectable member and the second member, the other of the first deflectable member and the second member being provided with a second electrode, a charge on the first floating electrode being selected so as to position the deflectable member at a desired separation distance from the second member;
    at least one of the deflectable member and the second member comprising an electrical element having an electrical characteristic dependent on a position of the first deflectable member relative to the second member.

21. A device as recited in claim 20, wherein the electrical element is a strain-sensitive resistor, a value of resistance of the strain-sensitive resistor being dependent on the position of the first deflectable member relative to the second member.

22. A device as recited in claim 20, wherein the electrical element is a capacitor comprising first and second capacitor electrodes, one of the first and second capacitor electrodes being provided on the first deflectable member so that a value of capacitance of the capacitor is dependent on the position of the first deflectable member relative to the second member.

23. A device as recited in claim 22, wherein the floating electrode is provided on the second member and the first deflectable member is provided with a grounded electrode.

24. A device as recited in claim 23, wherein the grounded electrode comprises one of the first and second capacitor electrodes provided on the first deflectable member.

25. A device as recited in claim 24, wherein the other of the first and second capacitor electrodes is provided on the second member.

26. A device as recited in claim 20, further comprising a hot electron injector provided to inject electrons to the first floating electrode.

27. A device as recited in claim 20, wherein the electrical device is formed, at least in part, from silicon.

28. A device as recited in claim 20, wherein the electrical device is formed, at least in part, from quartz.

29. A device as recited in claim 20, wherein the electrical device is formed, at least in part, from sapphire.

30. A MEMS-based device, comprising:
    a MEMS-based actuator having at least a first deflectable member and at least a second member, at least a first floating electrode disposed on one of the first deflectable member and the second member the other of the first deflectable member and the at least a second member being provided with a second electrode, a charge on the first floating electrode being selected so as to position the first deflectable member at a desired separation distance from the second member.

31. A device as recited in claim 30, wherein the second electrode is a grounded electrode.

32. A device as recited in claim 30, wherein the second electrode is a second floating electrode.

33. A device as recited in claim 30, wherein the second member is deflectable.

34. A device as recited in claim 30, further comprising a hot electron injector provided to inject electrons to the first floating electrode.

35. A device as recited in claim 30, further comprising a second floating electrode disposed on the other of the first deflectable member and the second member, wherein charges on the first and second floating electrodes are selected to as to position the first deflectable member at the desired separation distance from the second member.

36. A device as recited in claim 30, wherein the device is formed, at least in part, from silicon.

37. A device as recited in claim 30, wherein the device is formed, at least in part, from quartz.

38. A device as recited in claim 30, wherein the device is formed, at least in part, from sapphire.

* * * * *